(12) United States Patent
Nagata

(10) Patent No.: US 9,018,747 B2
(45) Date of Patent: Apr. 28, 2015

(54) OPTICAL SEMICONDUCTOR APPARATUS

(75) Inventor: Michikazu Nagata, Kyoto (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 14/237,330

(22) PCT Filed: Aug. 17, 2012

(86) PCT No.: PCT/JP2012/070905
§ 371 (c)(1),
(2), (4) Date: Feb. 5, 2014

(87) PCT Pub. No.: WO2013/027669
PCT Pub. Date: Feb. 28, 2013

(65) Prior Publication Data
US 2014/0197528 A1  Jul. 17, 2014

(30) Foreign Application Priority Data

Aug. 22, 2011 (JP) ................................. 2011-180691
Dec. 21, 2011 (JP) ................................. 2011-279748

(51) Int. Cl.
*H01L 23/02* (2006.01)
*H01L 23/04* (2006.01)
*H01L 31/0203* (2014.01)
*H01L 33/58* (2010.01)
*H01S 3/02* (2006.01)
*H01L 33/48* (2010.01)

(52) U.S. Cl.
CPC ............. *H01L 23/04* (2013.01); *H01L 31/0203* (2013.01); *H01L 33/486* (2013.01); *H01L 33/58* (2013.01); *H01L 2224/49171* (2013.01); *H01L 33/483* (2013.01); *H01S 3/02* (2013.01)

(58) Field of Classification Search
USPC .................................. 257/678, 680, 99, 710
See application file for complete search history.

(56) References Cited

U.S. PATENT DOCUMENTS 5,296,724 A * 3/1994 Ogata et al. ................. 257/98
6,653,724 B1 * 11/2003 Kim et al. .................... 257/684
(Continued)

FOREIGN PATENT DOCUMENTS

JP  2002094035 A  3/2002
JP  2003100920 A  4/2003
(Continued)

OTHER PUBLICATIONS

International Search Report, PCT/JP2012/070905, Oct. 3, 2012, 1 pp.

*Primary Examiner* — Jasmine Clark
(74) *Attorney, Agent, or Firm* — Volpe and Koenig, P.C.

(57) ABSTRACT

An optical semiconductor apparatus includes a lid body bonded to an upper surface of a frame body, the lid body having an opening at a position vertically overlapping with an optical semiconductor device. The lid body has a first portion which is positioned to surround the opening and has an upper surface to which a light-transmissive member is bonded, a second portion which is positioned to surround the first portion, and a third portion which is positioned to surround the second portion and has a lower surface to which the frame body is bonded. The upper surface of the first portion is positioned lower than an upper surface of the third portion. The second portion has a thin-walled portion positioned to surround the first portion, the thin-walled portion having a thickness thinner than that of the first portion as well as thinner than that of the third portion.

7 Claims, 12 Drawing Sheets

(56) References Cited

U.S. PATENT DOCUMENTS

| | | | | |
|---|---|---|---|---|
| 6,867,366 B2 * | 3/2005 | Nemoto | ........................ | 174/559 |
| 7,166,907 B2 * | 1/2007 | Onishi et al. | ................... | 257/680 |
| 7,408,205 B2 * | 8/2008 | Webster et al. | ................. | 257/99 |

2008/0296719 A1   12/2008   Ichikawa

FOREIGN PATENT DOCUMENTS

| | | |
|---|---|---|
| JP | 2004363511 A | 12/2004 |
| JP | 2008298708 A | 12/2008 |

* cited by examiner

OPTICAL SEMICONDUCTOR APPARATUS

FIELD OF INVENTION

The present invention relates to an optical semiconductor apparatus housing an optical semiconductor device which is an optical device typified by a semiconductor laser, a photodiode and an optical sensor. Such an optical semiconductor apparatus can be used as a component of an imaging apparatus.

BACKGROUND

As an optical semiconductor apparatus on which an optical semiconductor device such as an imaging device is mounted, for example, an optical apparatus described in Japanese Unexamined Patent Publication JP-A 2002-94035 is known. Since the optical semiconductor device performs surface emission/reception of light, a light-transmitting hole is formed in a cap (lid body) included in the optical apparatus. The light-transmitting hole is closed by a light-transmitting window (light-transmissive member).

Generally, the inside of a package is sealed at low pressure in the optical semiconductor apparatus for suppressing degeneration of the optical semiconductor device due to oxidation and so on. Accordingly, external pressure is liable to be applied to the lid body and there is a possibility that stress due to the external pressure is concentrated at a connecting part of the lid body and the light-transmissive member and bonding performance of the lid body with respect to the light-transmissive member is reduced.

An object of the invention is to provide an optical semiconductor apparatus having good bonding performance of the lid body with respect to the light-transmissive member.

SUMMARY

An optical semiconductor apparatus according to an aspect of the invention includes a substrate, an optical semiconductor device placed on an upper surface of the substrate, a frame body disposed on the upper surface of the substrate so as to surround the optical semiconductor device, a lid body bonded to an upper surface of the frame body, the lid body having an opening at a position vertically overlapping with the optical semiconductor device, and a light-transmissive member bonded to an upper surface of the lid body so as to cover the opening.

Further, the lid body has a first portion which is positioned so as to surround the opening and has an upper surface to which the light-transmissive member is bonded, a second portion which is positioned so as to surround the first portion, and a third portion which is positioned so as to surround the second portion and has a lower surface to which the frame body is bonded. Then, the upper surface of the first portion is positioned lower than an upper surface of the third portion, and the second portion has a thin-walled portion positioned so as to surround the first portion, the thin-walled portion having a thickness thinner than a thickness of the first portion as well as thinner than a thickness of the third portion.

DETAILED DESCRIPTION OF THE PREFERRED EMBODIMENTS

Figure 1:
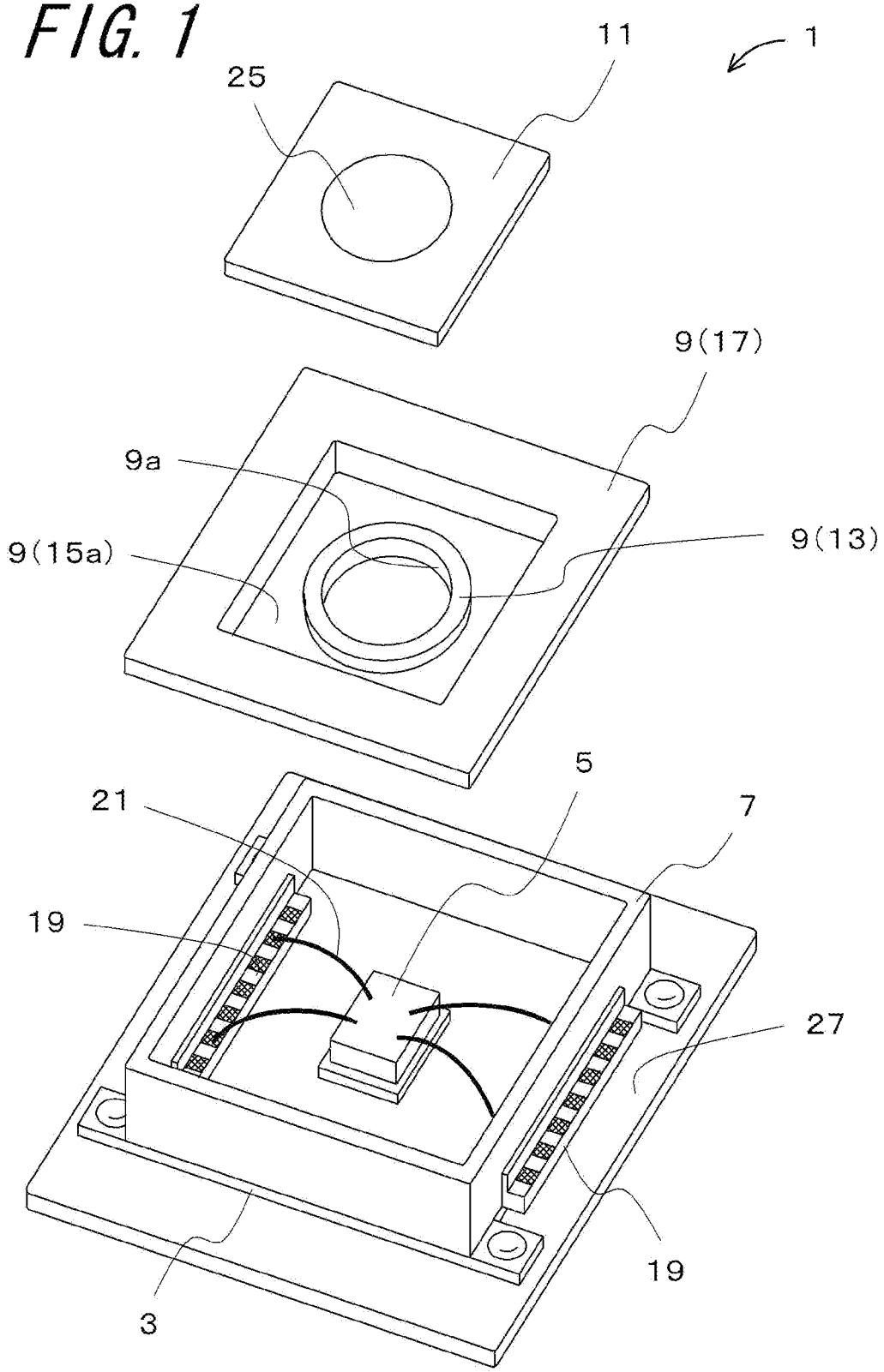
FIG. 1 is an exploded perspective view showing an optical semiconductor apparatus according to an embodiment of the invention.

As shown in FIGS. 1 to 5, an optical semiconductor apparatus 1 according to the present embodiment includes a substrate 3, an optical semiconductor device 5 placed on an upper surface of the substrate 3, a frame body 7 disposed on the upper surface of the substrate 3 so as to surround the optical semiconductor device 5, a lid body 9 bonded to an upper surface of the frame body 7, having an opening 9a at a position vertically overlapping with the optical semiconductor device 5, and a light-transmissive member 11 bonded to an upper surface of the lid body 9 so as to cover the opening 9a.

The lid body 9 includes a first portion 13 which is positioned so as to surround the opening 9a, a second portion 15 which is positioned so as to surround the first portion 13, and a third portion 17 which is positioned so as to surround the second portion 15. The light-transmissive member 11 is bonded to an upper surface of the first portion 13. The frame body 7 is bonded to a lower surface of the third portion 17. The upper surface of the first portion 13 is positioned lower than an upper surface of the third portion 17. Then, the second portion 15 has a thin-walled portion 15a positioned so as to surround the first portion 13. A thickness D2 of the thin-walled portion 15a is thinner than a thickness D1 of the first portion 13 and a thickness D3 of the third portion 17.

In the optical semiconductor apparatus 1 according to the present embodiment, the upper surface of the first portion 13 to which the light-transmissive member 11 is bonded is positioned lower than the upper surface of the third portion 17. Accordingly, the optical semiconductor apparatus 1 can be shaped in a low profile. It is further possible to suppress contact or friction on the upper surface of the first portion 13 due to external factors, which can reduce the occurrence of scratches or damage on the upper surface of the first portion 13. The optical semiconductor apparatus 1 according to the present embodiment also has the thin-walled portion 15a positioned so that the second portion 15 surrounds the first portion 13.

Since the optical semiconductor apparatus 1 according to the present embodiment has the thin-walled portion 15a as described above, it is possible to suppress the concentration of stress at the first portion 13 and the third portion 17 by allowing the stress to be concentrated at the thin-wall portion 15a. Additionally, since the thin-wall portion 15a is liable to be elastically deformed as compared to portions having a larger thickness in a vertical direction thereof, the stress can be absorbed in this portion. It is also possible to store excess bonding members such as solder for bonding the light-transmissive member 11 to the upper surface of the first portion 13 over the thin-walled portion 15a. Therefore, it is possible to provide the optical semiconductor apparatus 1 having excellent bonding performance, airtightness, durability and assembly accuracy of the lid body 9 with respect to the light-transmissive member 11 and the frame body 7.

The substrate 3 in the present embodiment has a square-plate shape, including a placing region on which the optical semiconductor device 5 is placed on the upper surface thereof. The placing region means a region overlapping with the optical semiconductor device 5 in a plan view of the substrate 3 in the present embodiment. Though the placing region is formed at the center of the upper surface in the present embodiment, there is no problem that the placing region is formed at, for example, an end of the upper surface of the substrate 3 since the region where the optical semiconductor device 5 is mounted is the placing region. Additionally, the substrate 3 in the present embodiment has one placing region, however, the substrate 3 may have plural placing regions and the optical semiconductor devices 5 may be placed on respective placing regions.

As the substrate 3, a member in a square-plate shape having an illustrative size of approximately 5 to 20 mm as one side in a plan view and having a thickness of approximately 0.5 to 2 mm can be used. Though the substrate 3 in the present embodiment has the square-plate shape, it is not always necessary that the upper surface thereof is flat. For example, a concave portion may be provided on the upper surface of the substrate 3 and part of a bottom surface of the concave portion may be used as the placing region.

The optical semiconductor device 5 is disposed on the placing region of the substrate 3. The optical semiconductor device 5 is electrically connected to input/output terminals 19 by bonding wires 21. The optical semiconductor device 5 can input/output signals with respect to an external electric circuit (not shown) through the bonding wires 21 and the input/output terminals 19.

As the optical semiconductor device 5, a light emitting device typified by an LD (Laser Diode) device or a light receiving device typified by a PD (Photo Diode) device can be used. When the light emitting device is used as the optical semiconductor device 5, an external signal is inputted to the light emitting device from the external electric circuit to thereby emit light to the outside through the light-transmissive member 11. On the other hand, when the light receiving device is used as the optical semiconductor device 5, light incident on the inside of the apparatus through the light-transmissive member 11 is received by the light receiving device to thereby output an external signal to the external electric circuit. Accordingly, the optical semiconductor device 5 is placed at a position vertically overlapping with the opening 9a of the lid body 9.

In the case where the optical semiconductor device 5 having an electrode unit on the lower surface of the device is directly disposed on the upper surface of the substrate 3, it is required that the substrate 3 has high insulation performance at portions at least other than a wiring conductor in which the optical semiconductor device 5 is disposed. The substrate 3 in the present embodiment is fabricated by stacking plural insulating members. Then, the optical semiconductor device 5 is placed on the placing region of the substrate 3. As insulating members, for example, ceramic materials such as an alumina-based sintered compact, a mullite-based sintered compact, a silicon carbide-based sintered compact, an aluminum nitride-based sintered compact and a silicon nitride-based sintered compact or glass ceramic materials can be used.

A mixed member is prepared by mixing material powder including these glass powder and ceramic powder, an organic solvent and binder. The mixed member is shaped into a sheet to thereby prepare plural ceramic green sheets. The prepared plural ceramic green sheets are laminated to thereby prepare plural stacked bodies. The stacked bodies are integrally fired at a temperature of approximately 1600 degrees to thereby prepare the substrate 3. The substrate 3 is not limited to the structure in which plural insulating members are stacked one on top of another. The substrate 3 may be formed of one insulating member.

The optical semiconductor device 5 may be directly mounted on the upper surface of the substrate 3, however a mounting substrate 23 for mounting the optical semiconductor device 5 which is disposed on the placing region of the substrate 3 may be provided and the optical semiconductor device 5 may be mounted on the mounting substrate 23 as in the optical semiconductor apparatus 1 according to the embodiment. Members having high insulation performance are preferably used for the mounting substrate 23 in the same manner as the insulating members which are, for example, ceramic materials such as the alumina-based sintered compact, the mullite-based sintered compact, the silicon carbide-based sintered compact, the aluminum nitride-based sintered compact and the silicon nitride-based sintered compact or glass ceramic materials.

When the above mounting substrate 23 is provided, in addition to the insulating members represented by the above materials, for example, resin members such as silicone resin, acrylic resin or epoxy resin, metal members such as iron, copper, nickel, chrome, cobalt or tungsten, or alloys of these metals and composite metal materials including these metals can be used as the substrate 3.

The optical semiconductor apparatus 1 according to the present embodiment has the frame body 7 provided on the upper surface of the substrate 3 so as to surround the placing region. As the frame body 7, for example, ceramic materials such as the alumina-based sintered compact, the mullite-based sintered compact, the silicon carbide-based sintered compact, the aluminum nitride-based sintered compact or the silicon nitride-based sintered compact, or glass ceramic materials can be used in the same manner as the substrate 3.

It is also possible to use, in addition to the members having high insulation performance, for example, metal members such as iron, copper, nickel, chrome, cobalt or tungsten, or alloys of these metals. The metal member constituting the frame body 7 can be prepared by performing metal processing such as rolling processing or punching processing to an ingot of the above metal member. The frame body 7 may be made of one member or may have a stacked structure of plural members.

The substrate 3 and the frame body 7 may be bonded to each other through a bonding member, or may be integrally formed. As the bonding member, for example, resin materials such as the silicone resin, acrylic resin or epoxy resin, or a brazing material can be used. Examples of the brazing material include silver solder.

The lid body 9 is bonded to the frame body 7 so as to seal the optical semiconductor device 5. The lid body 9 is bonded to the upper surface of the frame body 7. Then, the optical semiconductor device 5 is sealed in space surrounded by the substrate 3, the frame body 7 and the lid body 9. The optical semiconductor device 5 is sealed as described above, thereby suppressing deterioration of the optical semiconductor device 5 by the use of the optical semiconductor apparatus 1 for a long period of time. As the lid body 9, for example, metal members such as iron, copper, nickel, chrome, cobalt or tungsten, alloys of these metals, or resin members such as silicone resin, acrylic resin or epoxy resin can be used.

The metal member forming the lid body 9 can be fabricated by performing metal processing such as rolling processing or punching processing to an ingot of the above metal member. The resin member constituting the lid body 9 can be also prepared by filling a mold form with the above resin materials to be thermally cured. Though the lid body 9 may be made of one member as well as made of plural members to be bonded together. The lid body 9 can be bonded to the frame body 7 by using, for example, seam welding. The lid body 9 may be bonded to the frame body 7 by welding as described above as well as may be bonded to the frame body 7 by using, for example, gold-tin solder.

The lid body 9 in the present embodiment includes the first portion 13 which is positioned so as to surround the opening 9a, the second portion 15 which is positioned so as to surround the first portion 13, and the third portion 17 which is positioned so as to surround the second portion 15. The light-transmissive member 11 is bonded to the upper surface of the first portion 13. The frame body 7 is bonded to the lower surface of the third portion 17. The upper surface of the first portion 13 is positioned lower than the upper surface of the third portion 17.

The first portion 13 in the present embodiment means a portion positioned so as to surround the opening 9a and positioned just under a region bonded to the light-transmissive member 11 on the upper surface of the lid body 9. The third portion 17 in the present embodiment means a portion positioned just above a region bonded to the frame body 7 on the lower surface of the lid body 9. Then, the second portion 15 means a portion sandwiched by the first portion 13 and the third portion 17 in the lid body 9.

Also in the optical semiconductor apparatus 1 according to the present embodiment, the upper surface of the first portion 13 to which the light-transmissive member 11 is bonded is positioned lower than the upper surface of the third portion 17. Additionally, the second portion 15 in the present embodiment has the thin-walled portion 15a positioned so as to surround the first portion 13. The thickness D2 of the thin-walled portion 15a is thinner than the thickness D1 of the first portion 13 and the thickness D3 of the third portion 17. Accordingly, stress can be absorbed in the thin-walled portion 15a while the optical semiconductor apparatus 1 is allowed to be shaped in a low profile, and therefore, bonding performance and airtightness of the lid body 9 with respect to the light-transmissive member 11 and the frame body 7 can be made excellent.

Furthermore, the stress generated when the lid body 9 is bonded to the frame body 7 by seam welding is not directly transmitted from the third portion 17 to the light-transmissive member 11 and is transmitted through the second portion 15. Accordingly, the stress to be transmitted to the light-transmissive member 11 is alleviated due to deformation or deflection of the second portion 15, and therefore, it is possible to suppress breaks, cracks and separation occurring in the light-transmissive member 11 or the bonding member for bonding the light-transmissive member 11 to the lid body 9. As a result, manufacturing yield and airtightness of the optical semiconductor apparatus 1 can be improved.

Figure 2:
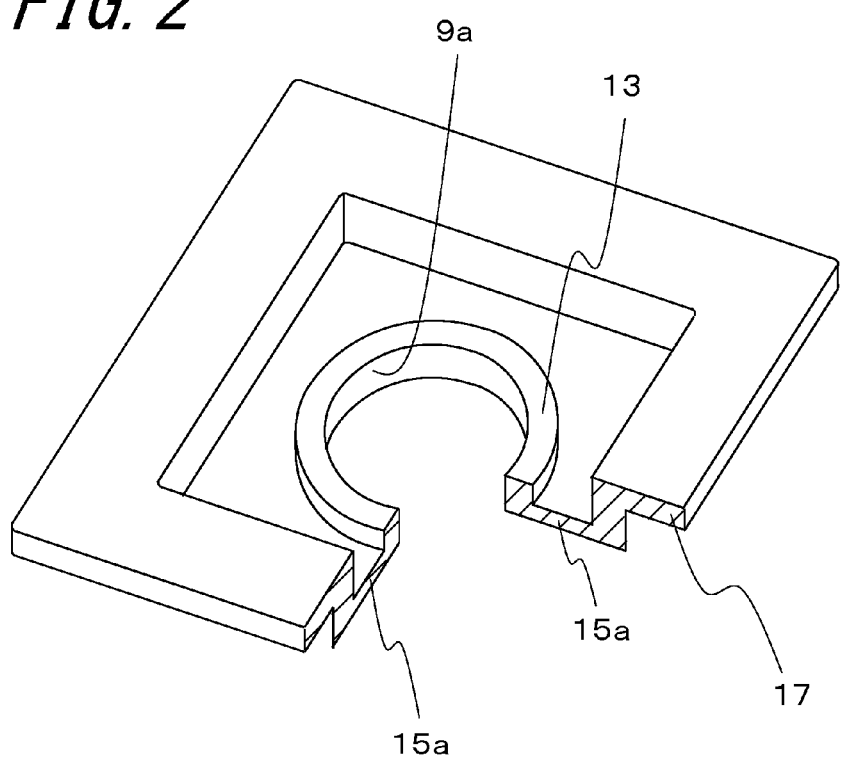
FIG. 2 is a partial cross-sectional perspective view showing a lid body in the optical semiconductor apparatus shown in FIG. 1.
Figure 3:
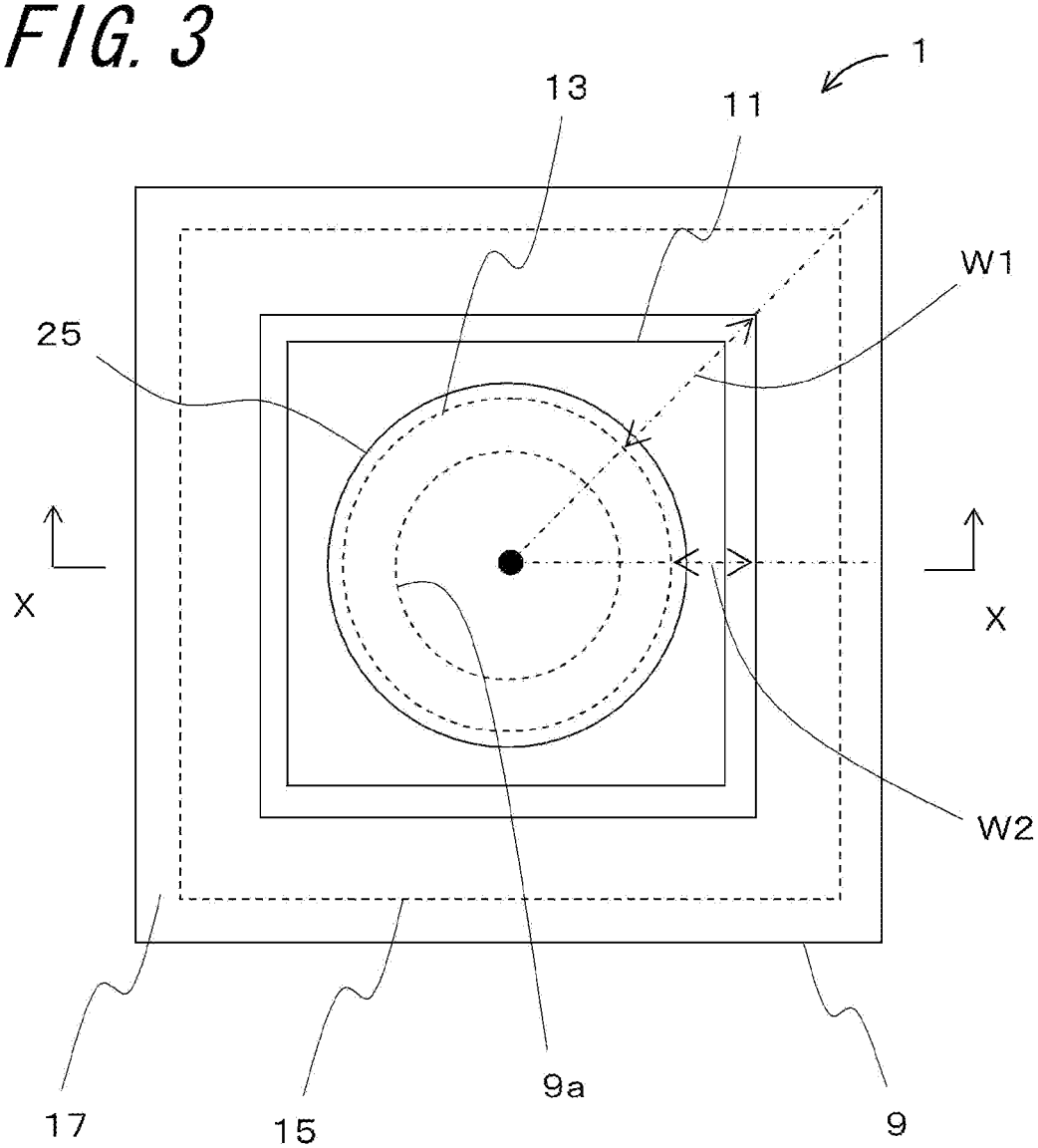
FIG. 3 is a plan view of the optical semiconductor apparatus shown in FIG. 1.
Figure 4:
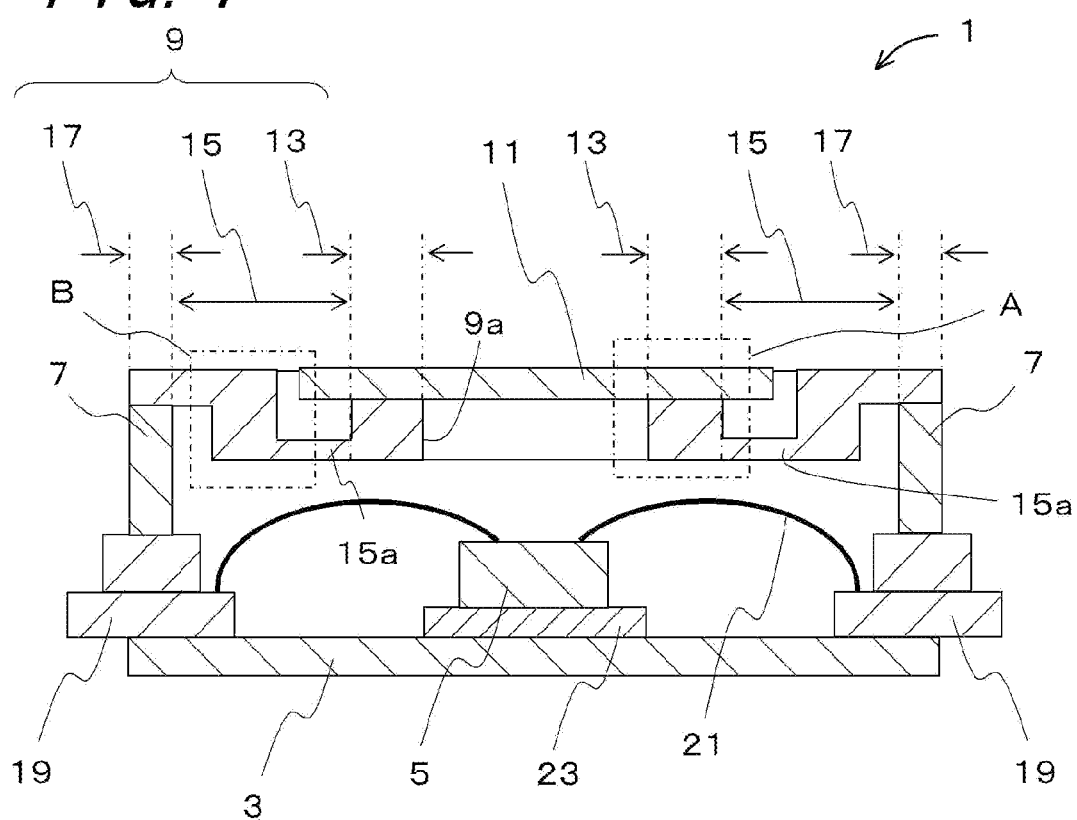
FIG. 4 is a cross-sectional view taken along the line X-X of the optical semiconductor apparatus shown in FIG. 3.
Figure 6:
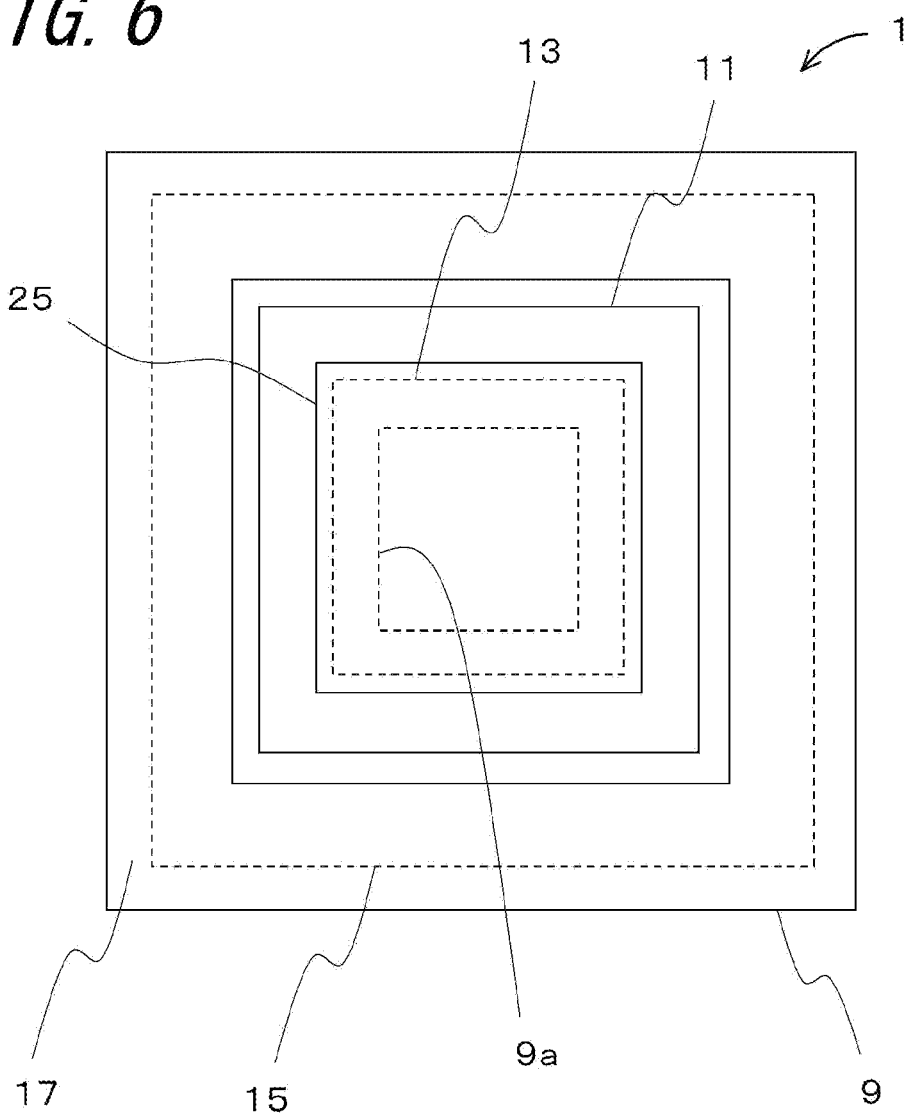
FIG. 6 is a plan view showing a first modified example of the optical semiconductor apparatus shown in FIG. 1.
Figure 7:
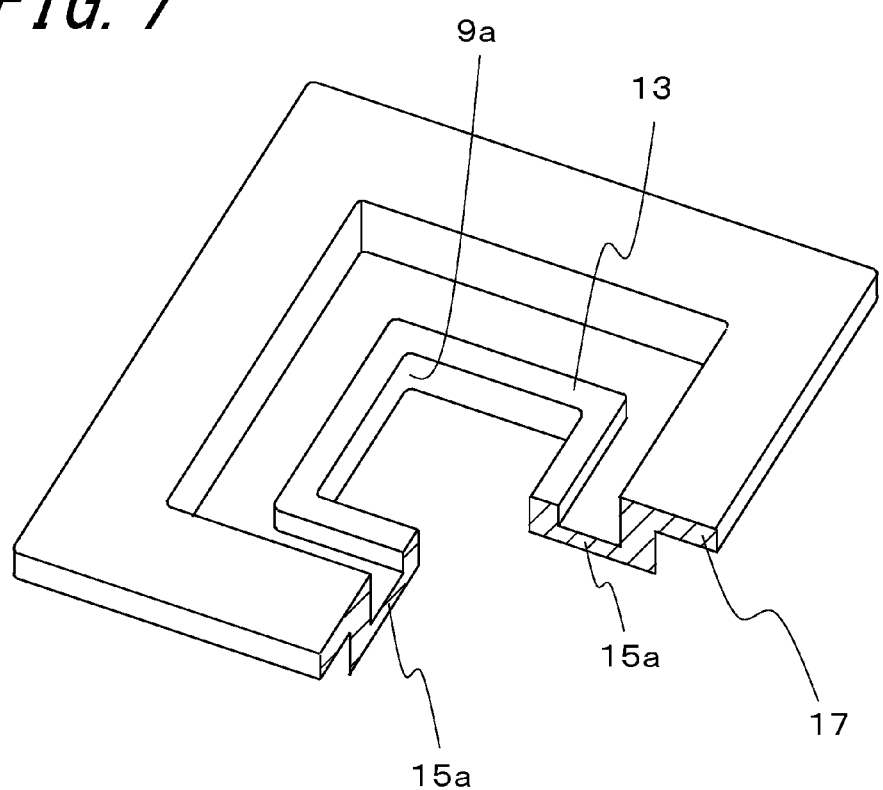
FIG. 7 is a partial cross-sectional perspective view showing a lid body in the optical semiconductor apparatus shown in FIG. 6.

The opening 9a of the lid body 9 in the present embodiment is formed to have a circular shape in a plan view. Accordingly, the first portion 13 positioned so as to surround the opening 9a is a ring-shaped portion. The opening 9a may be formed to have a square shape in a plan view as shown in FIGS. 6 and 7. However, in the case where the opening 9a has the circular shape in a plan view and the first portion 13 is the ring-shaped portion as shown in FIGS. 2 and 3, it is possible to reduce the possibility that force to be applied from the light-transmissive member 11 to the lid body 9 is concentrated at part of the first portion 13 of the lid body 9, that is, for example, a corner portion. Accordingly, bonding performance and airtightness between the light-transmissive member 11 and the lid body 9 can be further improved. The illustrative size of the opening 9a can be approximately 2 to 10 mm in radius when the opening 9a has the circular shape. The illustrative size of the first portion 13 can be approximately 0.2 to 1 mm in the thickness D1. Concerning sizes of the lid body 9 as a specific example shown in FIGS. 6 and 7, a length of a long side of an outer edge in a plan view is set to 44 mm, a length of a short side of the outer edge in a plan view is set to 18 mm, a length of a long side of the opening 9a in a plan view is set to 33 mm, and a length of a short side of the opening 9a in a plan view is set to 20 mm. Moreover, a length of the first portion 13 in a plan view is set to 0.3 mm, a length of the second portion 15 in a plan view is set to 16.7 mm, and a length of the third portion 17 in a plan view is set to 1 mm. Furthermore, a length of the first portion in the vertical direction is set to 0.6 mm, a length of the second portion 15 in the vertical direction is set to 1.05 mm, a length of the thin-wall portion 15a in the vertical direction is 0.25 mm, and a length of the third portion 17 in the vertical direction is set to 0.25 mm.

Figure 5:
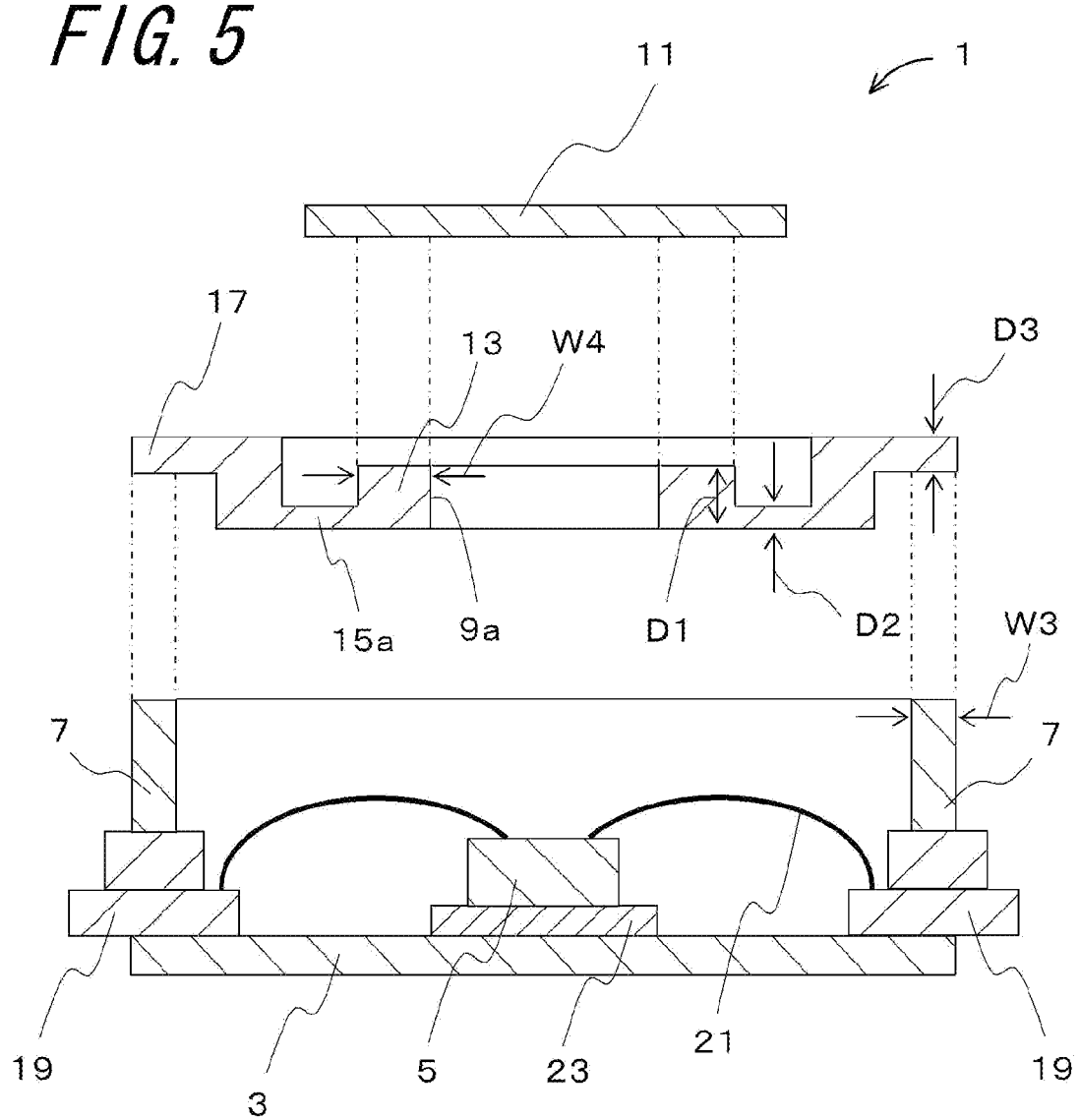
FIG. 5 is an exploded cross-sectional view of the optical semiconductor apparatus shown in FIG. 4.

The second portion 15 in the present embodiment has a step portion so that the height of an upper surface at a place adjacent to the third portion 17 is higher than the height of an upper surface at a place adjacent to the first portion 13 as shown in FIGS. 2 and 5. Since such a step portion is provided, the position of the light-transmissive member 11 can be lowered without reducing the inner space of the optical semiconductor apparatus 1 excessively.

Particularly, the step portion in the present embodiment is formed in a crank shape so that the height of a lower surface at a place adjacent to the third portion 17 is also higher than the height of a lower surface at a place adjacent to the first portion as shown in FIGS. 2 and 5. Accordingly, the position of the light-transmissive member 11 can be lowered, that is, the height of the light-transmissive member 11 protruding in the upper direction from the upper surface of the third portion 17 can be suppressed to be lower while reducing the entire thickness of the lid body 9.

Figure 12:
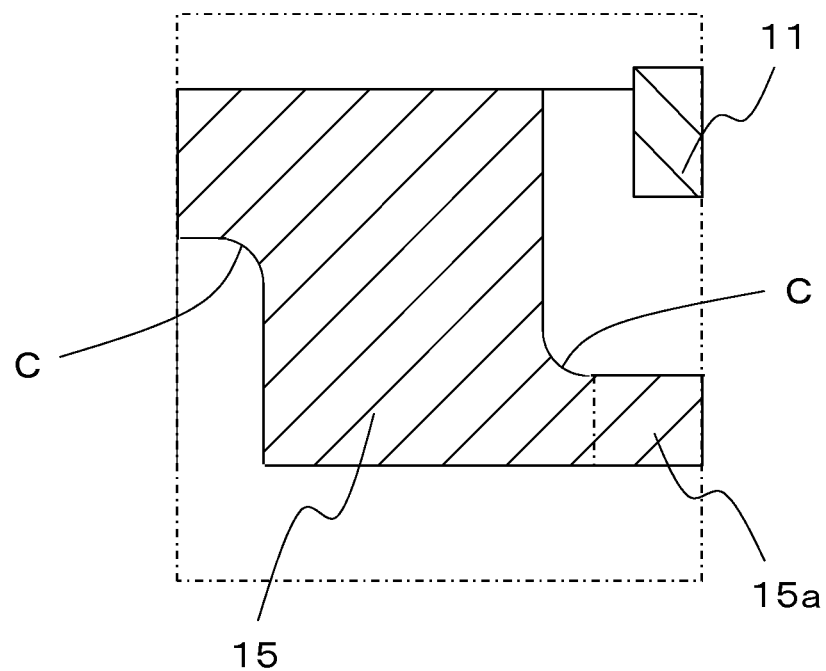
FIG. 12 is an enlarged cross-sectional view obtained by enlarging a region B of the optical semiconductor apparatus shown in FIG. 4.

At this time, it is preferable that corner portions C having a concave shape at regions in the crank shape have a curved-surface shape as shown in FIG. 12. Though the stress is liable to be concentrated at these corner portions C having the concave shape when the thin-walled portion 15a is deformed, the durability of the corner portions C can be increased when the corner portions C have the curved-surface shape as shown in FIG. 6. Therefore, it is possible to improve the durability of the lid body 9 without increasing the thickness of the second portion 15.

The frame body 7 in the present embodiment has a square shape having four sides in a plan view. Accordingly, the third portion 17 in the lid body 9 which is the place to be bonded to the frame body 7 has a square-ring shape having four sides. As described above, the first portion 13 is the ring-shaped portion and the third portion 17 has the square-ring shape portion. Accordingly, in the second portion 15 in the present embodiment, an outer peripheral portion has a square shape and an inner peripheral portion has a circular shape in a plan view. The illustrative size of the second portion 15 can be 0.1 to 0.4 mm in the thickness D2 of the thin-walled portion 15a. The thickness of portions other than the thin-walled portion 15a can be approximately 0.2 to 0.5 mm.

It is preferable that a width W1 of the thin-walled portion 15a on an imaginary line connecting a corner portion of the outer peripheral portion of the third portion 17 to the center of the opening 9a is wider than a width W2 of the thin-walled portion 15a on an imaginary line connecting each side of the outer peripheral portion of the third portion 17 to the center of the opening 9a. This is because stress concentrated at the corner portions of the outer peripheral portion of the third portion 17 and transmitted to the light-transmissive member 11 through the second portion 15 at the time of bonding the lid body 9 to the frame body 7 is easily alleviated and absorbed by the thin-walled portion 15a, which is formed to have wide width, on the imaginary lines connecting the corner portions of the outer peripheral portion of the third portion 17 to the center of the opening 9a. Accordingly, it is possible to suppress breaks or cracks in the light-transmissive member 11 as well as separation or cracks at a joint portion with respect to the first portion 13 due to the stress generated when the lid body 9 is bonded to the frame body 7, which maintains airtightness of the optical semiconductor apparatus 1 in a good condition.

However, when the step portion is provided as in the second portion 15 in the present embodiment, the thickness in the step portion does not mean the thickness in the vertical direction but means the thickness in a direction horizontal to the upper surface of the substrate 3. The illustrative size of the third portion 17 can be approximately 0.2 to 0.5 mm in the thickness D3. As described above, the thickness D2 of the thin-walled portion 15a is preferably 0.1 mm or more thinner than the thickness D1 of the first portion 13 and the thickness D3 of the third portion 17.

The light-transmissive member 11 is bonded to the upper surface of the first portion 13 in the lid body 9 so as to cover the opening 9a of the lid body 9. The light-transmissive member 11 of the present embodiment has a square-plate shape, and the illustrative size thereof is approximately 3 to 20 mm as one side in a plan view and approximately 0.2 to 2 mm in thickness.

As the light-transmissive member 11, members transmitting light in a good condition are used for receiving light from the outside by the optical semiconductor device 5 or for emitting light to the outside from the optical semiconductor device 5. Specifically, for example, glass members containing silicon as a main component or transmissive resin can be used as the light-transmissive member 11. At a joint portion with respect to the lid body 9 on a lower surface of the light-transmissive member 11, a metallization layer (not shown) may be formed. When the metallization layer is formed, the light-transmissive member 11 can be bonded to the lid body 9 easily.

When the light-transmissive member 11 is deformed, reflection and refraction of light on the surface of the light-transmissive member 11 is changed, and therefore, there is a possibility that it is difficult to perform predetermined light emission or light reception due to change of light reception in the optical semiconductor device 5 or light emission from the optical semiconductor device 5 to the outside. Accordingly, it is preferable that rigidity of the light-transmissive member 11 is higher than rigidity of the lid body 9. For example, rigidity of the light-transmissive member 11 can be higher than the rigidity of the lid body 9 by using the above glass member as the light-transmissive member 11 and by using the above metal members or resin members as the lid body 9. It is also preferable that an anti-reflection film 25 is formed on an upper surface and/or the lower surface of the light-transmissive member 11 at a portion vertically overlapping with the opening 9a of the lid body 9, for the purpose of suppressing light reflection itself on the surface of the light-transmissive member 11.

It is further preferable that an outline of the light-transmissive member 11 is larger than the opening 9a. Accordingly, the stress generated at the joint portion at the time of bonding the light-transmissive member 11 to the first portion 13 is hard to be transmitted to an outer peripheral end of the light-transmissive member 11 which is liable to be a generation source of breaks or cracks, as a result, the breaks or cracks in the light-transmissive member 11 can be suppressed as well as airtightness of the optical semiconductor device 1 can be maintained.

Additionally, the light-transmissive member 11 may be bonded to the first portion 13 so that the upper surface thereof is positioned lower than the upper surfaces of the second portion 15 and the third portion 17. As a result, the light-transmissive member 11 is formed so that the upper surface thereof is surrounded by the upper surfaces of the second portion 15 and the third portion 17, which can suppress contact or friction on the light-transmissive member 11 due to external factors in the optical semiconductor apparatus 1 as well as can reduce the occurrence of scratches or damage on the light-transmissive member 11.

It is also preferable that the light-transmissive member 11 has the same shape as the outline of the thin-walled potion 15a, which can reduce a gap between the light-transmissive member 11 and the upper surface of the second portion 15, therefore, it is possible to suppress the intrusion of dust or small particles in the air into the thin-walled portion 15a and thus to suppress appearance defects of the optical semiconductor apparatus 1.

Figure 8:
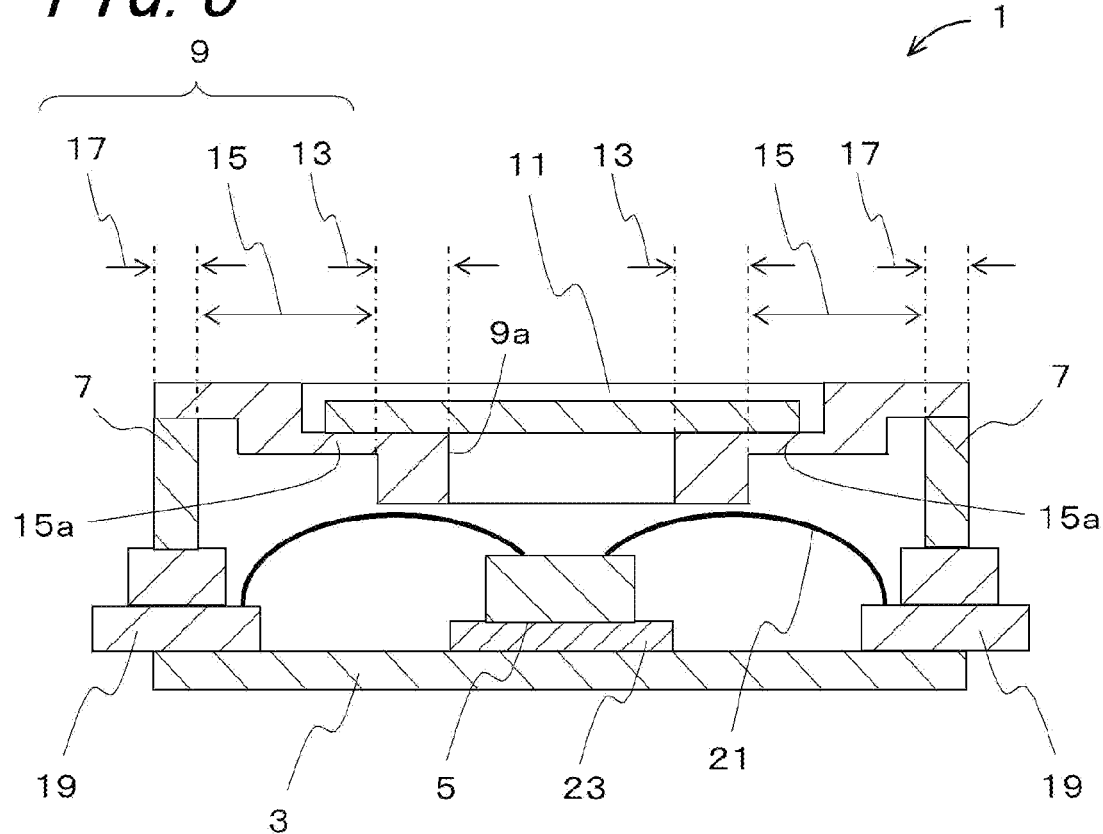
FIG. 8 is a plan view showing a second modified example of the optical semiconductor apparatus shown in FIG. 4.
Figure 9:
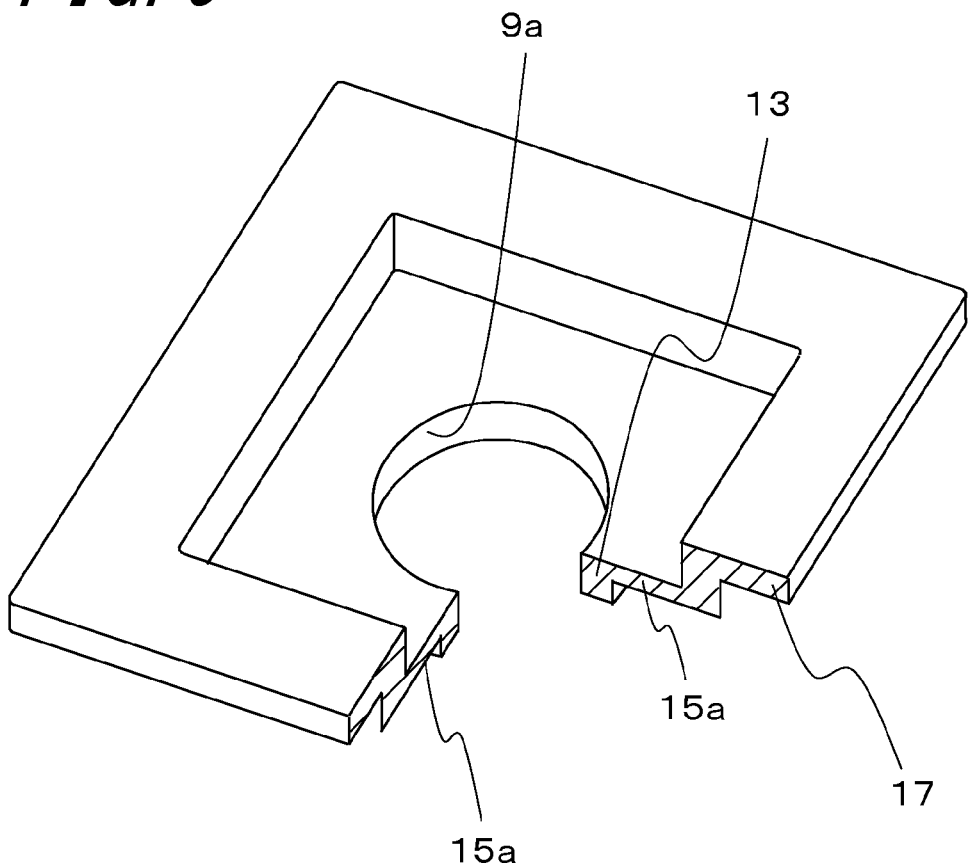
FIG. 9 is a partial cross-sectional perspective view showing a lid body in the optical semiconductor apparatus shown in FIG. 8.
Figure 10:
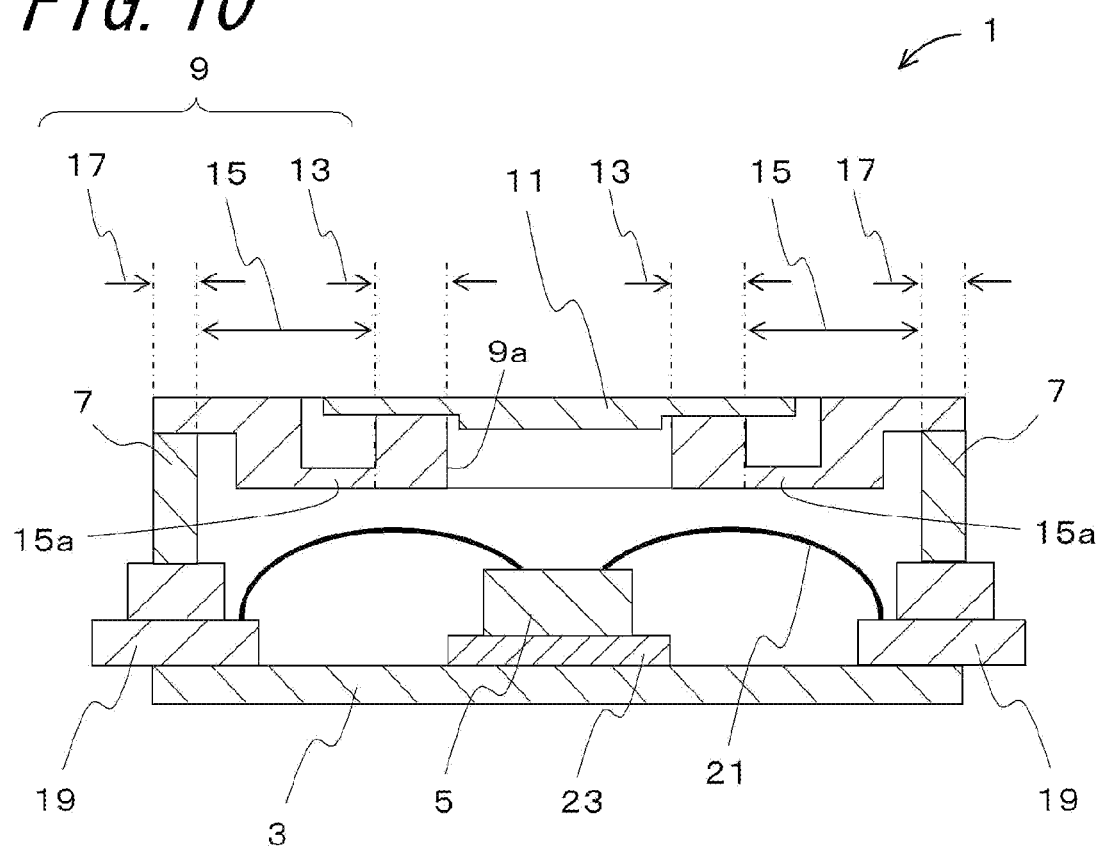
FIG. 10 is a plan view showing a third modified example of the optical semiconductor apparatus shown in FIG. 4.

As shown in FIGS. 8 and 9, the upper surface of the first portion 13 may be in the same height as the upper surface of the second portion 15 at the place adjacent to the first portion 13 for the purpose of suppressing the height of the light-transmissive member 11 protruding in the upper direction from the upper surface of the third portion 17 as well as for the purpose of efficiently performing input/output of light between the semiconductor device 5 and the outside of the optical semiconductor apparatus 1 through the light-transmissive member 11 by allowing the light to propagate through the first portion 13 when receiving light from outside by the optical semiconductor device 5 or emitting light to the outside from the optical semiconductor device 5. However, it is preferable that the upper surface of the first portion 13 is positioned higher than the upper surface of the second portion 15 at the place adjacent to the first portion 13 as shown in FIGS. 2 and 5 in a point that stress transmitted from the third portion 17 to the light-transmissive member 11 is alleviated by deformation or deflection of the second portion 15. The light-transmissive member 11 is bonded to the upper surface of the first portion 13.

Additionally, a height position of the upper surface of the light-transmissive member 11 is preferably set so as to be lower than a height position of the upper surface of the second portion 15 at the place adjacent to the third portion 17 as shown in FIG. 8. Since the light-transmissive member 11 is formed so as to be housed inside the lid body 9, an opportunity that the light-transmissive member 11 makes contact with the outside can be reduced, which prevents the damage of the light-transmissive member 11 by getting scratched. The height position of the upper surface of the light-transmissive member 11 is set so as to be lower than the height position of the upper surface of the second portion 15, for example, by 0.25 mm or more.

Furthermore, the height position of the upper surface of the light-transmissive member 11 may be set so as to correspond to the height position of the upper surface of the second portion 15 at the place adjacent to the third portion 17. When the height positions of the upper surfaces of the lid body 9 and the light-transmissive member 11 are set so as to correspond to each other, the tilt of the light-transmissive member 11 with respect to the upper surface of the second portion 15 can be easily checked by viewing the optical semiconductor apparatus 1 from the side. As a result, function effects can be achieved such that time and costs caused by shipping inspection of the optical semiconductor apparatus 1 can be reduced and that dust and small particles adhering to the upper surface of the second portion 15 and the upper surface of the light-transmissive member 11 can be cleaned at the same time on the same plane.

Moreover, a peripheral region surrounding a central region on the lower surface of the light-transmissive member 11 may be concave so that the peripheral region is positioned higher than the central region. A concave portion on the lower surface of the light-transmissive member 11 is continuously formed along an outer edge of the lower surface of the light-transmissive member 11. Then, the upper surface of the first portion 13 is bonded to the concave portion of the light-transmissive member 11. A depth of the concave portion is set to, for example, approximately 0.05 mm to 0.5 mm. The thickness of the outer edge of the light-transmissive member 11 can be thinner by providing the concave portion on the lower surface of the light-transmissive member 11. Since the height position of the upper surface of the light-transmissive member 11 can be lowered when the first portion 13 is bonded to the concave portion of the light-transmissive member 11, the optical semiconductor apparatus can be lowered in height as well as positional displacement of the light-transmissive member 11 in the parallel direction with respect to the opening 9a can be suppressed by the concave portion.

Incidentally, the optical semiconductor device 5 is placed at a position vertically overlapping with the opening 9a of the lid body 9. Accordingly, when the upper surface of the first portion 13 is positioned higher than the upper surface of the second portion 15 at the place adjacent to the first portion 13, a gap between the substrate 3 and the light-transmissive member 11 becomes large, and therefore, space of a portion where the optical semiconductor device 5 is placed in the space surrounded by the substrate 3, the frame body 7 and the lid body 9 can be widely taken. Accordingly, the semiconductor device 5 can be easily placed onto the substrate 3 as well as the optical semiconductor apparatus 1 can be minimized and highly integrated.

It is also preferable that the upper surface of the second portion 15 is apart from the lower surface of the light-transmissive member 11. In the optical semiconductor apparatus 1 according to the present embodiment, bonding performance and airtightness of the lid body 9 with respect to the light-transmissive member 11 and the frame body 7 are improved by intentionally deforming the thin-wall portion 15a in the second portion 15.

When the second portion 15 abuts on the light-transmissive member 11, the deformation of the thin-walled portion 15a may be interrupted as the second portion 15 sticks to the light-transmissive member 11. However, when the upper surface of the second portion 15 is apart from the lower surface of the light-transmissive member 11, the possibility that the second portion 15 makes contact with the light-transmissive member 11 can be reduced. Accordingly, the thin-walled portion 15a can be deformed favorably.

In particular, the thin-walled portion 15a of the second portion 15 is preferably apart from the light-transmissive member 11. Since the thickness of the second portion 15 is thinner than remaining portions, the rigidity thereof is low. Accordingly, when the thin-walled portion 15a abuts on the light-transmissive member 11, the deformation of the thin-walled portion 15a is interrupted as well as excessively large stress is applied to the thin-walled portion 15a, which may lead to breakage. However, when the thin-walled portion 15a is apart from the light-transmissive member 11, the thin-walled portion 15a can be deformed smoothly as well as the possibility of breakage in the thin-walled portion 15a can be reduced.

Figure 11:
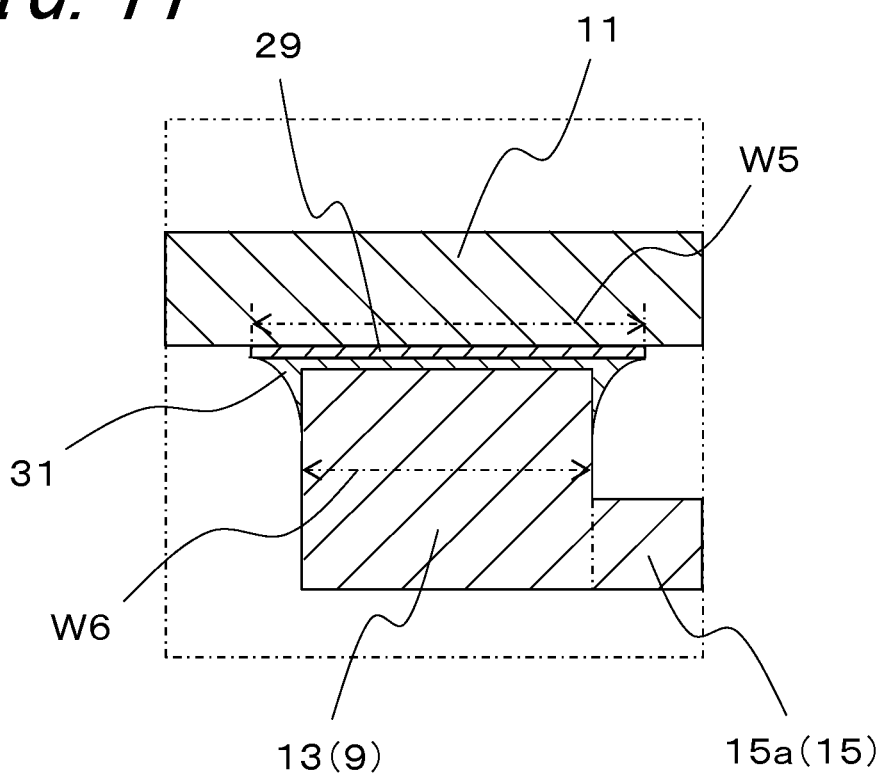
FIG. 11 is an enlarged cross-sectional view obtained by enlarging a region A of the optical semiconductor apparatus shown in FIG. 4.

The optical semiconductor apparatus 1 in the present embodiment has a metallization layer 29 at the joint portion of the lower surface of the light-transmissive member 11 with respect to the first portion 13 so as to surround the opening 9a as shown in FIG. 11. The optical semiconductor apparatus 1 according to the present embodiment includes a bonding member 31 which bonds the metallization layer 29 to the first portion 13. Since the metallization layer 29 is provided, bonding performance between the lid body 9 and the light-transmissive member 11 by the bonding member 31 can be increased.

At this time, it is preferable that a width W5 of the metallization layer 29 is larger than a width W6 of the first portion 13 in a cross section perpendicular to the upper surface of the substrate 3. Here, the width W6 of the first portion 13 does not mean the entire external diameter in a plan view of the first portion 13 but means the difference between an internal diameter and an external diameter of the first portion 13 as shown in FIG. 11.

As described above, when the metallization layer 29 is formed, the light-transmissive member 11 can be bonded to the lid body 9 stably even when slight positional displacement occurs in the light-transmissive member 11 at the time of bonding the light-transmissive member 11 to the lid body 9.

It is particularly preferable that an inner periphery of the metallization layer 29 is positioned inside an inner periphery of the first portion 13 as well as an outer periphery of the metallization layer 29 is positioned outside the outer periphery of the first portion 13. In such a case, the bonding member 31 is easily bonded also to side surfaces of the first portion 13 also shown in FIG. 11. When the bonding member 31 is bonded to the side surfaces of the first portion 13, a bonding area between the first portion 13 and the bonding member 31 can be increased as well as the bonding member 31 can be bonded to the first portion 13 from plural directions.

Accordingly, even when the stress in a direction inclined to the direction perpendicular to the upper surface of the substrate 3 is applied to the first portion 13, the light-transmissive member 11 can be bonded to the first portion 13 stably by a portion of the bonding member 31 bonded to the upper surface of the first portion 13 and a portion of the bonding member 31 bonded to the side surfaces of the first portion 13.

The bonding member 31 is bonded to an inside surface and an outside surface of the first portion 13 respectively in the optical semiconductor apparatus 1 according to the present embodiment. That is, the first portion 13 is held by the bonding member 31 in a sandwiched manner. Accordingly, the light-transmissive member 11 can be bonded to the first portion 13 in an extremely stable manner.

As metal materials forming the metallization layer 29, for example, tungsten, molybdenum, manganese, nickel, copper, silver and gold can be used. As the bonding member 31, for example, resin members such as silicone resin, acrylic resin or epoxy resin or a brazing material can be used. Examples of the brazing material include silver solder.

The semiconductor apparatus 1 having the above structure is used as a part of an electronic apparatus by mounting the substrate 3 on a mounting board 27. The optical semiconductor apparatus according to one embodiment of the invention has been explained as the above, and the invention is not limited to the above embodiment. That is, there is no problem that various modifications and combination of embodiments are performed without departing from the scope of the invention.

What is claimed is:

1. An optical semiconductor apparatus, comprising:
   a substrate;
   an optical semiconductor device placed on an upper surface of the substrate;
   a frame body disposed on the upper surface of the substrate to surround the optical semiconductor device;
   a lid body bonded to an upper surface of the frame body, the lid body having an opening at a position vertically overlapping with the optical semiconductor device; and
   a light-transmissive member bonded to an upper surface of the lid body to cover the opening,
   the lid body having a first portion which is positioned to surround the opening and has an upper surface to which the light-transmissive member is bonded, a second portion which is positioned to surround the first portion, and a third portion which is positioned to surround the second portion and has a lower surface to which the frame body is bonded, and
   the upper surface of the first portion being positioned lower than an upper surface of the third portion, and the second portion having a thin-walled portion positioned to surround the first portion, the thin-walled portion having a thickness thinner than a thickness of the first portion as well as thinner than a thickness of the third portion.

2. The optical semiconductor apparatus according to claim 1, wherein the first portion is a ring-shaped portion positioned to surround the opening.

3. The optical semiconductor apparatus according to claim 1, wherein the upper surface of the first portion is positioned higher than an upper surface of the thin-walled portion.

4. The optical semiconductor apparatus according to claim 1, wherein the light-transmissive member has a square-plate shape and bonded only to the first portion, the thin-walled portion is connected to the first portion, and the upper surface of the thin-walled portion is apart from a lower surface of the light-transmissive member.

5. The optical semiconductor apparatus according to claim 1, wherein a height position of an upper surface of the light-transmissive member is lower than a height position of an upper surface of the second portion at a place adjacent to the third portion.

6. The optical semiconductor apparatus according to claim 1, wherein a height position of an upper surface of the light-transmissive member is set to correspond to a height position of an upper surface of the second portion at a place adjacent to the third portion.

7. The optical semiconductor apparatus according to claim 1, wherein a peripheral region surrounding a central region on a lower surface of the light-transmissive member is concave so that the peripheral region is positioned higher than the central region, and the first portion is bonded to a concave portion of the light-transmissive member.

\* \* \* \* \*